United States Patent
Kakinuma et al.

(10) Patent No.: US 8,729,539 B2
(45) Date of Patent: May 20, 2014

(54) LIGHT-EMITTING APPARATUS

(71) Applicant: Canon Kabushiki Kaisha, Tokyo (JP)

(72) Inventors: Nobuaki Kakinuma, Tokyo (JP); Seishi Miura, Mobara (JP); Koichi Ishige, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/767,328

(22) Filed: Feb. 14, 2013

(65) Prior Publication Data

US 2013/0234120 A1    Sep. 12, 2013

(30) Foreign Application Priority Data

Mar. 9, 2012 (JP) ................. 2012-052456

(51) Int. Cl.
*H01L 27/32* (2006.01)
*H01L 31/0236* (2006.01)
*H01L 33/20* (2010.01)

(52) U.S. Cl.
USPC ............. 257/40; 257/80; 257/89; 257/466; 438/29; 438/42; 438/66; 438/99

(58) Field of Classification Search
CPC . H01L 27/32; H01L 27/3206; H01L 27/3216; H01L 33/20
USPC .............. 257/40, 88, 89, E33.055, E51.018; 313/483, 500–506
See application file for complete search history.

(56) References Cited

U.S. PATENT DOCUMENTS

| | | | |
|---|---|---|---|
| 6,091,195 A * | 7/2000 | Forrest et al. | 313/504 |
| 8,193,699 B2 | 6/2012 | Fujioka et al. | |
| 2009/0284144 A1 | 11/2009 | Fujioka et al. | |
| 2010/0007271 A1 * | 1/2010 | Lee et al. | 313/504 |
| 2012/0127221 A1 | 5/2012 | Tamaki et al. | |
| 2012/0248475 A1 * | 10/2012 | Yamada et al. | 257/89 |

FOREIGN PATENT DOCUMENTS

JP    2009-277590 A    11/2009

* cited by examiner

*Primary Examiner* — Olik Chaudhuri
*Assistant Examiner* — Christine Enad

(57) ABSTRACT

Provided is a light-emitting apparatus which, without using an insulating film for separating pixels, inhibits leakage current between adjacent pixels and which accommodates higher resolution. By providing a groove in an insulating layer along an edge of a first electrode, the thickness of a first charge transport layer is reduced to inhibit leakage current between adjacent pixels.

20 Claims, 2 Drawing Sheets

LIGHT-EMITTING APPARATUS

BACKGROUND OF THE INVENTION

1. Field of the Invention

The present invention relates to a light-emitting apparatus using an organic electroluminescent (EL) element.

2. Description of the Related Art

In a light-emitting apparatus using an organic EL elements, pixels are formed by forming on a substrate a plurality of first electrodes, a film formed of a plurality of organic materials including an emission layer, and a second electrode in this order. By applying voltage between the first electrodes and the second electrode, charge is injected from the respective electrodes, and hole-electron recombination is generated in the emission layer to emit light. Generally, a plurality of first electrodes are formed on the substrate in a state of being electrically independent of one another, and the second electrode is formed so as to cover the plurality of first electrodes. By providing the first electrodes to be electrically independent of one another in this way, an arbitrarily selected place can be caused to emit light.

However, with the pixel number increase in a light-emitting apparatus in recent years, the problem of leakage current between closely-placed adjacent pixels is becoming obvious. Japanese Patent Application Laid-Open No. 2009-277590 proposes a method of inhibiting such leakage current between adjacent pixels by using an insulating film in a tapered shape for separating pixels.

However, in the method of inhibiting leakage current using the insulating film for separating pixels described above, it is necessary to form the insulating film for separating pixels, which is not suitable for higher-resolution pixels.

SUMMARY OF THE INVENTION

It is an object of the present invention to provide a light-emitting apparatus which, without using an insulating film for separating pixels, inhibits leakage current between adjacent pixels and which accommodates higher resolution.

According to a first aspect of the present invention, there is provided a light-emitting apparatus, including a plurality of organic EL elements formed on an insulating layer, in which: each of the plurality of organic EL elements includes a first electrode, a first charge transport layer, an emission layer, a second charge transport layer, and a second electrode which are formed on the insulating layer in this order; the first electrode is formed for each of the plurality of organic EL elements, and the first charge transport layer, the emission layer, the second charge transport layer, and the second electrode are formed in common to the plurality of organic EL elements; the insulating layer has a groove provided therein at least along an edge of the first electrode; a depth of the groove is larger than a thickness of the first charge transport layer; and a sum of the depth of the groove and the thickness of the first electrode is smaller than a sum of thicknesses of the first charge transport layer, the emission layer, and the second charge transport layer.

According to a second aspect of the present invention, there is provided a display apparatus, including a plurality of organic EL elements having different emission colors formed on an insulating layer, in which: each of the plurality of organic EL elements includes a first electrode, a first charge transport layer, an emission layer, a second charge transport layer corresponding to an emission layer, and a second electrode which are formed on the insulating layer in this order; the first electrode is formed for each of the plurality of organic EL elements, and the first charge transport layer, the second charge transport layer, and the second electrode are formed in common to the plurality of organic EL elements; the first charge transport layer is formed so as to have a thickness varying depending on the emission color of the each of the plurality of organic EL elements; the insulating layer has a groove provided therein at least along an edge of the first electrode; a depth of the groove is larger than a smallest thickness of the first charge transport layer; and a sum of the depth of the groove and the thickness of the first electrode is smaller than a smallest sum of thicknesses of the first charge transport layer, the emission layer, and the second charge transport layer.

According to the present invention, by providing the groove in the insulating layer along the edge of the first electrode, the thickness of the first charge transport layer can be reduced at the side surface of the first electrode and at the side surface of the groove in the insulating layer, and leakage current between adjacent pixels can be effectively inhibited.

Further features of the present invention will become apparent from the following description of exemplary embodiments with reference to the attached drawings.

DESCRIPTION OF THE EMBODIMENTS

Embodiments of the present invention are described in the following with reference to the attached drawings, but the present invention is not limited to these embodiments. Note that, well-known or publicly known technologies in the art are applied to parts which are not specifically illustrated or described herein.

First Embodiment

Figure 1:
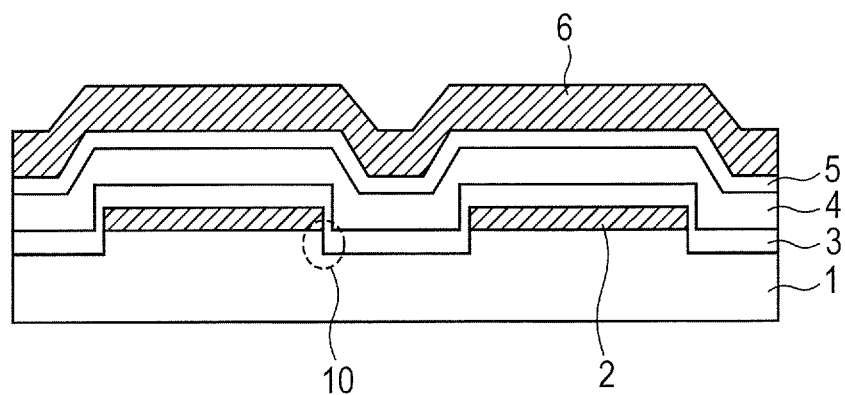
FIG. 1 is a sectional view schematically illustrating a structure of a first embodiment of the present invention.

FIG. 1 is a sectional view schematically illustrating a structure for two pixels (organic EL elements) of a light-emitting apparatus according to a first embodiment of the present invention.

The present invention relates to a light-emitting apparatus including a plurality of organic EL elements on an insulating layer. In this embodiment, an organic EL element includes a first electrode 2, a first charge transport layer 3, an emission layer 4, a second charge transport layer 5, and a second electrode 6 which are formed on an insulating layer 1 in this order. The first electrode 2 is formed for each organic EL element, and the first charge transport layer 3, the emission layer 4, the second charge transport layer 5, and the second electrode 6 are formed in common to the plurality of organic EL elements.

In this embodiment, the insulating layer 1 is formed of glass, a silicon wafer, a resin, or the like. A transistor or the like may be formed in a lower portion of the insulating layer 1 to control an electric signal of the first electrode 2.

The first electrode 2 is formed of an elemental metal, an alloy, or an oxide of aluminum, silver, chromium, titanium, cobalt, nickel, molybdenum, tungsten, indium, platinum, or the like.

The first charge transport layer 3 has the function of efficiently injecting a first charge from the first electrode 2 and the function of transporting the first charge to the emission layer 4 formed on the first charge transport layer 3. The first charge transport layer 3 may be a stacked film including a first charge injection layer for injecting the first charge from the first electrode 2 and a first charge transport layer for transporting the first charge. Further, the first charge transport layer 3 may be a stacked film including a first blocking layer for blocking a second charge which leaks from the emission layer 4.

The emission layer 4 is formed on the first charge transport layer 3 and the second charge transport layer 5 is formed on the emission layer 4. The second charge transport layer 5 has the function of efficiently injecting the second charge from the second electrode 6 and the function of transporting the second charge injected into the emission layer 4. The second charge transport layer 5 may be a stacked film including a second charge injection layer for injecting the second charge from the second electrode 6 and a second charge transport layer for transporting the second charge. Further, the second charge transport layer 5 may be a stacked film including a second blocking layer for blocking the first charge which leaks from the emission layer 4.

The second electrode 6 is formed so as to cover the plurality of first electrodes 2, and injects a charge different from that of the first electrode 2. The material of the second electrode 6 is similar to that of the first electrode 2, but one of the first electrode 2 and the second electrode 6 is a reflective electrode, and the other is a light-transmissive electrode. Therefore, the reflective electrode is formed using a highly reflective metal or formed by stacking a light-transmissive conductive layer and a highly reflective metal layer. The light-transmissive electrode is formed using a metal thin film or a light-transmissive conductive material such as indium tin oxide (ITO).

Figure 2:
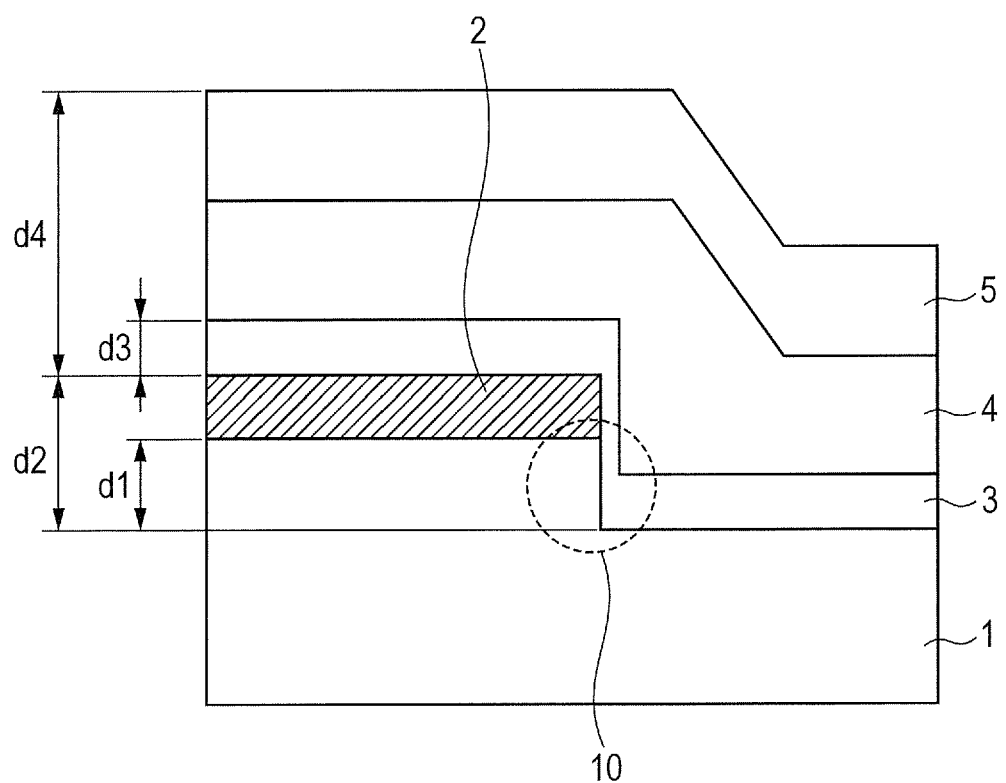
FIG. 2 is a partial enlarged view of the embodiment illustrated in FIG. 1.

According to the present invention, a groove 10 is formed in the insulating layer 1 at least along an edge of the first electrode 2. Note that, the edge of the first electrode 2 as used herein is an edge of the first electrode 2 in plan view as seen from the second electrode side (from above in the figure). The details of the groove 10 are now described with reference to FIG. 2. FIG. 2 is an enlarged view illustrating the region of the groove 10. The groove 10 and the edge of the first electrode 2 along which the groove 10 is formed extend in a direction perpendicular to the drawing plane of FIG. 2. Note that, by etching the insulating layer 1 with the first electrode 2 used as a mask, the groove 10 along an edge of the first electrode 2 is formed with ease.

In FIG. 2, the depth (d1) of the groove 10 formed in the insulating layer 1 is larger than the thickness (d3) of the first charge transport layer 3, and the sum (d2) of the depth of the groove 10 and the thickness of the first electrode 2 is smaller than the sum (d4) of the thicknesses of the first charge transport layer 3, the emission layer 4, and the second charge transport layer 5.

By providing the groove 10 in the insulating layer 1, the thickness of the first charge transport layer 3 formed at the side surface of the groove 10 is reduced. Therefore, a path through which current passes via the first charge transport layer 3 to the emission layer 4 on the first electrode 2 of the organic EL element adjacent to the edge of the first electrode 2 along which the groove 10 is provided can be narrowed. As a result, leakage current to the emission layer 4 on the first electrode 2 of the organic EL element adjacent to the edge of the first electrode 2 along which the groove 10 is provided can be inhibited. Further, the groove 10 provided in the insulating layer 1 is along the edge of the first electrode 2, that is, the patterns of the insulating layer 1 and the first electrode 2 are the same. Thus, compared with a case in which the groove 10 is provided not along the edge of the first electrode 2 but just in the insulating layer 1, the effect of thinning the first charge transport layer 3 at the side surface of the groove 10 is greater, and thus, the effect of inhibiting leakage current is greater.

Further, the shape of the groove 10 in section may be forward tapered, but a reverse tapered shape has a greater effect of thinning the first charge transport layer 3 at the side surface of the groove 10 and has a greater effect of inhibiting leakage current, and thus, a reverse tapered shape is preferred.

When the groove 10 is formed, there is a concern that, due to the insufficient coverage of the groove 10, the first electrode 2 and the second electrode 6 may be short-circuited. However, according to the present invention, by setting the sum (d2) of the depth of the groove 10 and the thickness of the first electrode 2 to be smaller than the sum (d4) of the thicknesses of the first charge transport layer 3, the emission layer 4, and the second charge transport layer 5, such a short-circuit between the first electrode 2 and the second electrode 6 can be prevented.

The light-emitting apparatus according to this embodiment can be applied to an image forming apparatus such as a laser beam printer. Specifically, an image forming apparatus includes a photosensitive member on which a latent image is to be formed by a light-emitting apparatus, and a charging unit for charging the photosensitive member. Further, the light-emitting apparatus according to the present invention may include a plurality of organic EL elements for emitting lights of different colors. In that case, the light-emitting apparatus can be used in a display or an electronic viewfinder of an imaging apparatus such as a digital camera or a digital camcorder having an imaging device such as a CMOS sensor. Further, the light-emitting apparatus can also be used in a display of an image forming apparatus or a display of a personal digital assistant such as a mobile phone or a smartphone. Further, the light-emitting apparatus according to the present invention may include a plurality of monochrome organic EL elements, and red, green, and blue color filters.

Second Embodiment

Figure 3:
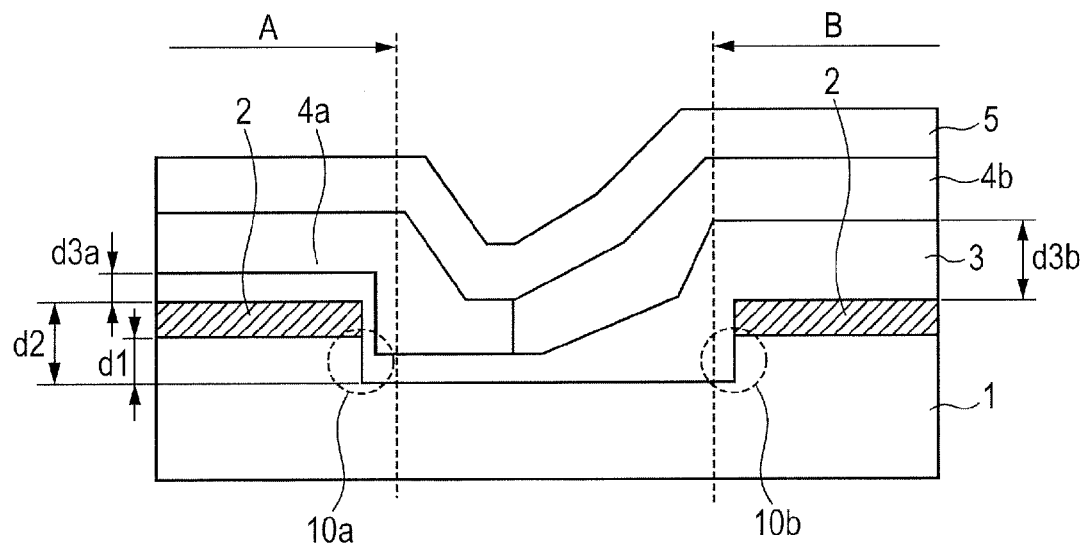
FIG. 3 is a sectional view schematically illustrating a structure of a second embodiment of the present invention.

FIG. 3 is a sectional view schematically illustrating a structure of a second embodiment of the present invention. FIG. 3 is an enlarged view illustrating end portions of two pixels A and B and a region therebetween. Note that, the second electrode is omitted.

In this embodiment, a light-emitting apparatus includes a plurality of organic EL elements for emitting lights of different colors. Further, the organic EL elements each include a first electrode 2, a first charge transport layer 3, an emission layer 4a or 4b corresponding to emission color, a second charge transport layer 5, and a second electrode (not shown) in this order. The first electrode 2 is formed for each organic EL element, and the first charge transport layer 3, the second charge transport layer 5, and the second electrode (not shown) are formed in common to the plurality of organic EL elements. Further, the first charge transport layer is formed so as to have different thicknesses depending on the color of light emitted by the organic EL element.

In FIG. 3, the pixel A and the pixel B emit lights of different colors. The emission layer 4a of the pixel A and the emission layer 4b of the pixel B are formed of materials which emit lights of different colors, and the thickness (d3a) of the first charge transport layer 3 of the pixel A and the thickness (d3b) of the first charge transport layer 3 of the pixel B are different from each other. The reason is that an adjustment to the optical length is necessary due to the different emission colors.

In a groove 10b of the pixel B, the thickness (d3b) of the first charge transport layer 3 is larger than the depth (d1) of the groove in the insulating layer 1, and the effect of thinning the first charge transport layer 3 by forming the groove is not obtained. However, in a groove 10a of the adjacent pixel A, the thickness (d3a) of the first charge transport layer 3 is smaller than the depth (d1) of the groove in the insulating layer 1, and the effect of thinning the first charge transport layer 3 by forming the groove is obtained.

In this case, leakage current between the pixel A and the pixel B is considered. In the groove 10a, the first charge transport layer 3 to be the path of the leakage current is narrowed, and thus, the leakage current can be inhibited. In this way, according to this embodiment, even when the thickness of the first charge transport layer 3 varies depending on the color of light emitted by the organic EL element, by thinning the first charge transport layer 3 by forming the groove at least in a region in which the first charge transport layer 3 is the thinnest, leakage current between pixels can be inhibited.

Further, a short-circuit between the first electrode 2 and the second electrode (not shown) due to the insufficient coverage of the grooves 10a and 10b can be prevented by taking into consideration only a region in which the sum of the thickness of the first charge transport layer 3, the thickness of the emission layer 4a or 4b corresponding thereto, and the thickness of the second charge transport layer 5 is the smallest.

Further, when the colors of lights emitted by adjacent organic EL elements are different from each other, by providing the groove only along edges which are opposed to the first electrodes of the adjacent organic EL elements, the flow of leakage current is prevented from changing the tones of the colors, and the influence on the display can be reduced.

Figure 4:
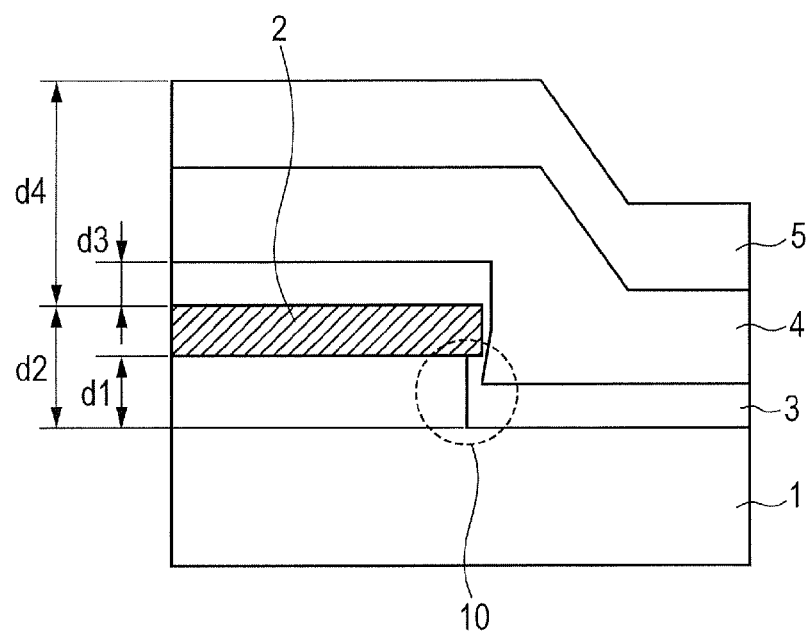
FIG. 4 is a sectional view schematically illustrating a structure of another embodiment of the present invention.

In the first and second embodiments described above, at the edge of the first electrode 2 along which the groove is formed, the side surface of the first electrode 2 and the side surface of the groove in the insulating layer 1 are continuous with each other, but the present invention is not limited thereto. For example, as illustrated in a schematic sectional view of FIG. 4, the first electrode 2 may protrude outward from the side surface of the groove 10 formed in the insulating layer 1. Such a structure enables more effective thinning of the first charge transport layer 3 formed at the side surface of the groove. The conditions of the thicknesses of the respective layers are similar to those of the first embodiment.

The light-emitting apparatus of this embodiment can be used in a display or an electronic viewfinder of an imaging apparatus such as a digital camera or a digital camcorder having an imaging device such as a CMOS sensor. Further, the light-emitting apparatus can also be used in a display of an image forming apparatus or a display of a personal digital assistant such as a mobile phone or a smartphone.

Example

A sample of the light-emitting apparatus having the structure illustrated in FIG. 1 was manufactured.

First, a TFT drive circuit using low-temperature polysilicon was manufactured on a glass substrate, and the insulating layer 1 of a polyimide resin was formed thereon. The thickness of the insulating layer 1 was 1.5 μm, and a contact hole was formed in the insulating layer 1 by photolithography.

Then, as the first electrode 2, a stacked film including aluminum and ITO was formed by sputtering, and patterning thereof was carried out. The thickness of aluminum was 30 nm, and the thickness of ITO was 10 nm. Therefore, the thickness of the first electrode 2 was 40 nm. The first electrode 2 was electrically connected to the TFT drive circuit through the contact hole formed in the insulating layer 1, so that an electric signal is sent only to a desired first electrode 2.

Three kinds of samples A, B, and C all in this state were manufactured. With regard to Sample A and Sample B, by carrying out oxygen plasma treatment, the insulating layer 1 was etched by 30 nm with the first electrode 2 used as a mask to form the groove 10. With regard to Sample C, the groove 10 was not formed.

Then, with regard to Sample A, Sample B, and Sample C, as the first charge transport layer 3, a film of α-NPD was formed at a thickness of 20 nm by vapor deposition.

Next, as the emission layer 4, a film of Balq doped with coumarin 6 was formed by vapor deposition. The thickness was 40 nm with regard to Sample A and Sample C, and was 20 nm with regard to Sample B.

Then, as the second charge transport layer 5, a co-evaporated film of $Alq_3$ and $Cs_2CO_3$ was formed at a thickness of 20 nm with regard to Sample A and Sample C and at a thickness of 10 nm with regard to Sample B.

Next, as the second electrode 6, a film of ITO was formed in a thickness of 50 nm by sputtering. The structures of Samples A, B, and C are shown in Table 1 below.

TABLE 1

|  | Sample A | Sample B | Sample C |
| --- | --- | --- | --- |
| d1 | 30 nm | 30 nm | 0 nm |
| d2 | 70 nm | 70 nm | 40 nm |
| d3 | 20 nm | 20 nm | 20 nm |
| d4 | 80 nm | 50 nm | 80 nm |
| Result | satisfactory | short-circuited | leakage current generated |

With regard to Samples A, B, and C manufactured as described above, only the region of a desired first electrode 2 was caused to emit light through the TFT drive circuit. As a result, with regard to Sample A, only the region of the desired first electrode 2 emitted light, but, with regard to Sample B, the first electrode 2 and the second electrode 6 were short-circuited and light was not emitted, and, with regard to Sample C, slight light emission due to leakage current was observed at a location adjacent to the desired first electrode 2.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-052456, filed Mar. 9, 2012, which is hereby incorporated by reference herein in its entirety.

What is claimed is:

1. A light-emitting apparatus, comprising a plurality of organic EL elements formed on an insulating layer, wherein:
   each of the plurality of organic EL elements comprises a first electrode, a first charge transport layer, an emission layer, a second charge transport layer, and a second electrode which are formed on the insulating layer in this order;
   the first electrode is formed for each of the plurality of organic EL elements;

the first charge transport layer, the emission layer, the second charge transport layer, and the second electrode are formed in common to the plurality of organic EL elements;

the insulating layer has a groove provided therein at least along an edge of the first electrode;

a depth of the groove is larger than a thickness of the first charge transport layer; and a sum of the depth of the groove and the thickness of the first electrode is smaller than a sum of thicknesses of the first charge transport layer, the emission layer, and the second charge transport layer.

2. The light-emitting apparatus according to claim 1, wherein the insulating layer comprises one of glass, a silicon wafer, and a resin.

3. The light-emitting apparatus according to claim 1, wherein the groove is reverse tapered.

4. The light-emitting apparatus according to claim 1, wherein, at the edge along which the groove is formed, a side surface of the first electrode protrudes outward from a side surface of the insulating layer.

5. The light-emitting apparatus according to claim 1, wherein, at the edge along which the groove is formed, a side surface of the first electrode and a side surface of the insulating layer are continuous with each other.

6. An image forming apparatus, comprising:
the light-emitting apparatus according to claim 1;
a photosensitive member on which a latent image is to be formed by the light-emitting apparatus; and
a charging unit for charging the photosensitive member.

7. A display apparatus, comprising a plurality of organic EL elements having different emission colors formed on an insulating layer, wherein:
each of the plurality of organic EL elements comprises a first electrode, a first charge transport layer, an emission layer, a second charge transport layer, and a second electrode which are formed on the insulating layer in this order;
the first electrode is formed for each of the plurality of organic EL elements;
the first charge transport layer, the emission layer, the second charge transport layer, and the second electrode are formed in common to the plurality of organic EL elements;
the insulating layer having a groove provided therein at least along an edge of the first electrode;
a depth of the groove is larger than a thickness of the first charge transport layer; and
a sum of the depth of the groove and the thickness of the first electrode is smaller than a sum of thicknesses of the first charge transport layer, the emission layer, and the second charge transport layer.

8. The display apparatus according to claim 7, wherein each of the plurality of organic EL elements comprises a color filter.

9. The display apparatus according to claim 7, wherein the insulating layer comprises one of glass, a silicon wafer, and a resin.

10. The display apparatus according to claim 7, wherein the groove is reverse tapered.

11. The display apparatus according to claim 7, wherein, at the edge along which the groove is formed, a side surface of the first electrode protrudes outward from a side surface of the insulating layer.

12. The display apparatus according to claim 7, wherein, at the edge along which the groove is formed, a side surface of the first electrode and a side surface of the insulating layer are continuous with each other.

13. An imaging apparatus, comprising:
the display apparatus according to claim 7; and
an imaging device.

14. A display apparatus, comprising a plurality of organic EL elements having different emission colors formed on an insulating layer, wherein:
each of the plurality of organic EL elements comprises a first electrode, a first charge transport layer, an emission layer, a second charge transport layer corresponding to an emission layer, and a second electrode which are formed on the insulating layer in this order;
the first electrode is formed for each of the plurality of organic EL elements;
the first charge transport layer, the second charge transport layer, and the second electrode are formed in common to the plurality of organic EL elements;
the first charge transport layer is formed so as to have a thickness varying depending on the emission color of each of the plurality of organic EL elements;
the insulating layer has a groove provided therein at least along an edge of the first electrode;
a depth of the groove is larger than a smallest thickness of the first charge transport layer included in the plurality of organic EL elements; and
a sum of the depth of the groove and the thickness of the first electrode is smaller than a smallest sum of thicknesses of the first charge transport layer, the emission layer, and the second charge transport layer in the plurality of organic EL elements.

15. The display apparatus according to claim 14, wherein, when the emission colors of adjacent organic EL elements are different from each other, the groove is formed only along edges which are opposed to the first electrodes of the adjacent organic EL elements.

16. The display apparatus according to claim 14, wherein the insulating layer comprises one of glass, a silicon wafer, and a resin.

17. The display apparatus according to claim 14, wherein the groove is reverse tapered.

18. The display apparatus according to claim 14, wherein, at the edge along which the groove is formed, a side surface of the first electrode protrudes outward from a side surface of the insulating layer.

19. The display apparatus according to claim 14, wherein, at the edge along which the groove is formed, a side surface of the first electrode and a side surface of the insulating layer are continuous with each other.

20. An imaging apparatus, comprising:
the display apparatus according to claim 14; and
an imaging device.

* * * * *